US009287111B2

(12) United States Patent
Kume (10) Patent No.: US 9,287,111 B2
(45) Date of Patent: Mar. 15, 2016

(54) OZONE GAS GENERATION PROCESSING APPARATUS, METHOD OF FORMING SILICON OXIDE FILM, AND METHOD FOR EVALUATING SILICON SINGLE CRYSTAL WAFER

(75) Inventor: Fumitaka Kume, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 78 days.

(21) Appl. No.: 14/234,435

(22) PCT Filed: Jul. 25, 2012

(86) PCT No.: PCT/JP2012/004732
§ 371 (c)(1),
(2), (4) Date: Jan. 23, 2014

(87) PCT Pub. No.: WO2013/031084
PCT Pub. Date: Mar. 7, 2013

(65) Prior Publication Data
US 2014/0134851 A1 May 15, 2014

(30) Foreign Application Priority Data

Aug. 26, 2011 (JP) ................................. 2011-184992

(51) Int. Cl.
*H01L 21/31* (2006.01)
*H01L 21/469* (2006.01)
(Continued)

(52) U.S. Cl.
CPC ........ *H01L 21/02238* (2013.01); *C23C 16/448* (2013.01); *C30B 29/06* (2013.01); *C30B 33/005* (2013.01); *H01L 21/02164* (2013.01); *H01L 22/14* (2013.01)

(58) Field of Classification Search
None
See application file for complete search history.

(56) References Cited

U.S. PATENT DOCUMENTS 6,130,542 A * 10/2000 Syo ................................ 324/719
6,168,961 B1 1/2001 Vaccari
(Continued)

FOREIGN PATENT DOCUMENTS

JP   A-2002-516186   6/2002
JP   A-2007-158314   6/2007

OTHER PUBLICATIONS

"Standard Test Method for Determining Net Carrier Density Profiles in Silicon Wafers by Capacitance-Voltage Measurements With a Mercury Probe," *ASTM Standards* F 1392-02.
(Continued)

*Primary Examiner* — Calvin Choi
(74) *Attorney, Agent, or Firm* — Oliff PLC (57) ABSTRACT

An ozone gas generation processing apparatus that includes a light source of ultraviolet rays and a wafer placement section, generates ozone gas by irradiating ultraviolet rays from the light source in an atmosphere containing oxygen, and processes a wafer on the wafer placement section with the ozone gas, the ozone gas generation processing apparatus comprising a light-blocking plate that allows the generated ozone gas to pass therethrough and blocks the ultraviolet rays between the light source and the wafer placed on the wafer placement section. An ozone gas generation processing apparatus and a method of forming an oxide film silicon film can make an adjustment to make thinner an oxide film formed on a wafer surface, the wafer surface is not damaged by ultraviolet rays when processed, and a method for evaluating a silicon single crystal wafer, obtaining a more stable measurement value of C-V characteristics are provided.

7 Claims, 4 Drawing Sheets (51) Int. Cl.
  *H01L 21/02*  (2006.01)
  *H01L 21/66*  (2006.01)
  *C30B 29/06*  (2006.01)
  *C23C 16/448* (2006.01)
  *C30B 33/00*  (2006.01)

(56) References Cited

U.S. PATENT DOCUMENTS

| 7,622,162 B1 * | 11/2009 | van Schravendijk et al. . 427/553 |
| 2002/0014625 A1 * | 2/2002 | Asami et al. .................... 257/57 |
| 2007/0020534 A1 * | 1/2007 | Yoshikawa et al. ............... 430/5 |
| 2007/0105344 A1 | 5/2007 | Uchida et al. |

OTHER PUBLICATIONS

"Standard Practice for Conversion Between Resistivity and Dopant Density for Boron-Doped; Phosphorus-Doped, and Arsenic-Doped Silicon," *ASTM Standards* F 723-99.

International Search Report issued in International Application No. PCT/JP2012/004732 on Oct. 16, 2012 (with translation).

* cited by examiner

OZONE GAS GENERATION PROCESSING APPARATUS, METHOD OF FORMING SILICON OXIDE FILM, AND METHOD FOR EVALUATING SILICON SINGLE CRYSTAL WAFER

TECHNICAL FIELD

The present invention relates to ozone gas generation processing apparatuses, methods of forming a silicon oxide film, and methods for evaluating a silicon single crystal wafer and, in particular, to a method for performing measurement of C-V characteristics of a silicon single crystal wafer by using a mercury electrode.

BACKGROUND ART

In the past, as a method for measuring the resistivity of a silicon single crystal wafer, a method for measuring C-V (capacitance-voltage) characteristics has been known. To measure the C-V characteristics, a Schottky junction is formed on the surface of a silicon single crystal wafer which is a sample, and a depletion layer is increased in the silicon single crystal wafer by application of a reverse bias voltage with the reverse bias voltage being continuously varied, whereby the capacity is varied. To form the Schottky junction on the surface of the silicon single crystal wafer, a mercury electrode, for example, is used.

When the silicon single crystal wafer which is a sample has an n-type region on the surface thereof (such as an n-type substrate and a wafer having an n-type epitaxial layer on the surface thereof), the surface of the wafer is oxidized in advance to form a thin silicon oxide film and a mercury electrode is joined onto the silicon oxide film, whereby it is possible to measure the C-V characteristics.

As the forming a thin silicon oxide film on a silicon single crystal wafer surface, a method by which a wafer is immersed in a solution containing an oxidizer such as hydrogen peroxide for a few minutes and then rinsing and drying are performed is known (Nonpatent Literature 1). However, in this method, since it takes about 20 minutes to perform from oxidation processing to drying, it is necessary to shorten the amount of time.

Thus, a method by which the surface of a wafer is oxidized by ozone gas by exposing a silicon single crystal wafer to ultraviolet light in an atmosphere containing oxygen is proposed (Patent Literature 1).

CITATION LIST

Patent Literatures

Patent Literature 1: JP-T-2002-516486

Nonpatent Literature

Nonpatent Literature 1: ASTM Standards F1392-02

DISCLOSURE OF INVENTION

When a silicon single crystal wafer is oxidized by ozone gas, a silicon oxide film is formed on the surface of the wafer. Since this silicon oxide film has insulating properties, the silicon oxide film functions as a capacitor arranged in series with a depletion layer when the C-V characteristics are measured. Since the capacity of the capacitor is inversely proportional to the thickness thereof, as the silicon oxide film becomes thicker, the capacity of the capacitor is decreased. Thus, since the capacity of the tandemly-arranged capacitor is the reciprocal of the sum of the reciprocals of the capacities, the thicker the silicon oxide film, the greater the influence thereof on the entire tandemly-arranged capacitor. As a result, the gradient of a graph depicting the relationship between the depth of an epitaxial layer and an impurity concentration, the graph obtained from the C-V characteristics, becomes larger and the accuracy of repeated measurement of an impurity concentration is decreased. Moreover, the surface of the silicon single crystal wafer is exposed to ultraviolet light and damaged, whereby noise is generated in the C-V characteristics.

The present invention has been made in view of the above-described problems, and an object thereof is to provide an ozone gas generation processing apparatus and a method of forming a silicon oxide film, the apparatus and the method that can make an adjustment to make thinner an oxide film formed on the surface of a wafer, the apparatus and the method in which the wafer surface is not damaged by the ultraviolet rays, when the wafer surface is processed with ozone gas generated by irradiating ultraviolet rays in an atmosphere containing oxygen, and a method for evaluating a silicon single crystal wafer, the method that uses the method of forming a silicon oxide film and can obtain a more stable measurement value of C-V characteristics than ever before.

Means for Solving Problem

To solve the above-described problems, the present invention provides an ozone gas generation processing apparatus that includes a light source of ultraviolet rays and a wafer placement section, generates ozone gas by irradiating ultraviolet rays from the light source in an atmosphere containing oxygen, and processes a wafer on the wafer placement section with ozone gas, the ozone gas generation processing apparatus comprising a light-blocking plate that allows the generated ozone gas to pass therethrough and blocks the ultraviolet rays between the light source and the wafer placed on the wafer placement section.

With the ozone gas generation processing apparatus of the present invention, since it is possible to perform oxidation processing with the wafer surface being little exposed to the ultraviolet rays, the ozone gas concentration near the wafer is reduced, which makes it possible to make an adjustment to make thinner an oxide film formed on the surface of the wafer. Moreover, since the wafer is not exposed directly to the ultraviolet rays, it is possible to suppress damage to the wafer surface caused by the ultraviolet rays. In a wafer (in particular, a silicon single crystal wafer having an n-type region on the surface thereof) on which an oxide film is formed by using such an ozone gas generation processing apparatus, noise is less likely to be generated in the C-V characteristics, making it possible to improve the accuracy of repeated measurement.

Moreover, at this time, it is preferable that a light-blocking rate of the light-blocking plate is 95% or more. Furthermore, it is preferable that a light-blocking rate of the light-blocking plate is less than 100%.

As described above, the light-blocking plate with a light-blocking rate of 95% or more is preferable because there is no possibility of the generation of noise in C-V characteristics.

Moreover, the light-blocking plate with a light-blocking rate of less than 100% is preferable because the ozone gas can reliably pass through the light-blocking plate and it is possible to form an oxide film with a desired thickness easily on the wafer surface.

Furthermore, at this time, it is preferable that the light-blocking plate is formed of a plurality of stacked punching metal sheets.

Such a light-blocking plate is preferable because it is a light-blocking plate that allows the generated ozone gas to pass therethrough and blocks the ultraviolet rays more reliably. By gradually shifting the locations of the holes when the plurality of punching metal sheets are stacked, it is possible to increase the light-blocking rate greatly. Moreover, it is preferable because the film thickness of an oxide film to be formed can be easily adjusted by adjusting the number of punching metal sheets and the locations of the holes of the punching metal sheets.

Furthermore, the present invention provides a method of forming a silicon oxide film including: generating ozone gas by irradiating ultraviolet rays in an atmosphere containing oxygen and forming a silicon oxide film on a silicon single crystal wafer surface by processing with the generated ozone gas, the method comprising: disposing a light-blocking plate that allows the generated ozone gas to pass therethrough and blocks the ultraviolet rays between a light source of the ultraviolet rays and the silicon single crystal wafer; and forming the silicon oxide film by making the ozone gas passed through the light-blocking plate react with the silicon single crystal wafer surface while blocking the ultraviolet rays.

With the method of forming a silicon oxide film of the present invention, since it is possible to perform silicon oxide film formation processing with the silicon single crystal wafer surface being little exposed to the ultraviolet rays, the ozone gas concentration near the silicon single crystal wafer is reduced, which makes it possible to make an adjustment to make thinner a silicon oxide film formed on the surface of the wafer. Moreover, since the silicon single crystal wafer is not exposed directly to the ultraviolet rays, it is possible to suppress damage to the silicon single crystal wafer surface caused by the ultraviolet rays.

Furthermore, at this time, it is preferable that the light-blocking plate with a light-blocking rate of 95% or more is used. Moreover, it is preferable that the light-blocking plate with a light-blocking rate of less than 100% is used.

As described above, the light-blocking plate with a light-blocking rate of 95% or more is preferable because there is no possibility of the generation of noise in C-V characteristics. Furthermore, the light-blocking plate with a light-blocking rate of less than 100% is preferable because the ozone gas can reliably pass through the light-blocking plate through a narrow space of the light-blocking plate and it is possible to form an oxide film with a desired thickness easily on the wafer surface.

Moreover, the present invention provides a method for evaluating a silicon single crystal wafer comprising: forming a silicon oxide film on a silicon single crystal wafer surface by the method of forming a silicon oxide film; and measuring C-V characteristics by joining a mercury electrode to the silicon oxide film.

With such a method for evaluating a silicon single crystal wafer, the method that forms a silicon oxide film by using the method of forming a silicon oxide film of the present invention, noise is less likely to be generated in the C-V characteristics, making it possible to improve the accuracy of repeated measurement.

Furthermore, at this time, it is preferable that the silicon single crystal wafer on which measurement is performed has an n-type region on the surface thereof. Moreover, it is preferable that the silicon single crystal wafer on which measurement is performed has an n-type epitaxial layer on the surface thereof.

As described above, as the silicon single crystal wafer on which measurement is performed, a silicon single crystal wafer having an n-type region on the surface thereof, for example, an n-type substrate and a wafer having an n-type epitaxial layer on the surface thereof can be used. In addition, by forming a silicon oxide film on the surface in an n-type region on the surface by the method of forming a silicon oxide film of the present invention, it is possible to perform suitably measurement of the C-V characteristics of the n-type region, the measurement using a mercury electrode.

Effect of Invention

As described above, with the ozone gas generation processing apparatus, the method of forming a silicon oxide film, and the method for evaluating a silicon single crystal wafer of the present invention, since it is possible to perform oxidation processing with a wafer surface being little exposed to ultraviolet rays, the ozone gas concentration near a wafer is reduced, which makes it possible to make an adjustment to make thinner an oxide film formed on the surface of the wafer. Moreover, since the wafer is not exposed directly to the ultraviolet rays, the wafer surface is not damaged by the ultraviolet rays, and noise is not generated in the C-V characteristics. As a result, it is possible to provide greater improvement in the accuracy of repeated measurement than ever before.

DESCRIPTION OF EMBODIMENTS

Hereinafter, the present invention will be described in detail, but the present invention is not limited to those described below.

As described earlier, in the past, there has been a problem that the accuracy of measurement of C-V characteristics is decreased due to a thick silicon oxide film formed by processing a silicon single crystal wafer surface with ozone gas. Moreover, there has been a problem that the surface of a silicon single crystal wafer is exposed to ultraviolet light and is damaged, whereby noise is generated in C-V characteristics.

Therefore, the inventors of the present invention have found out that, by providing a light-blocking plate that allows generated ozone gas to pass therethrough and blocks ultraviolet rays between a light source of ultraviolet rays and a wafer placement section in an ozone gas generation processing apparatus, it is possible to make an adjustment to make thinner an oxide film formed on the surface of a wafer, and, by suppressing damage to a wafer surface caused by the ultraviolet rays, it is possible to prevent generation of noise in C-V characteristics and thereby improve the accuracy of repeated measurement as a result, and completed the present invention.

Figure 1:
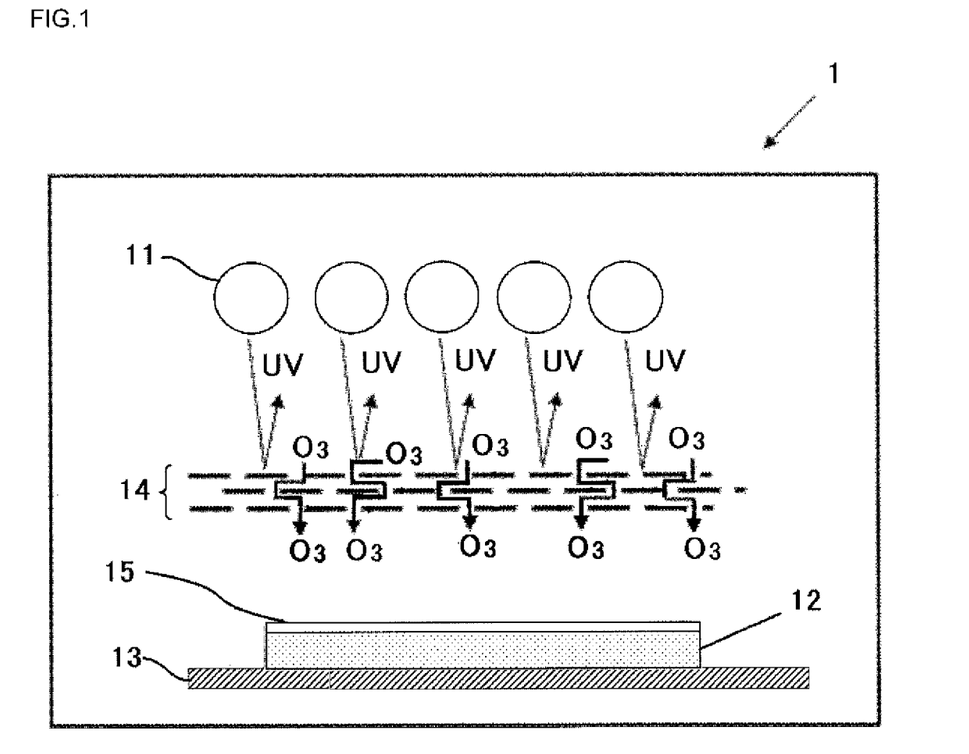
FIG. 1 is a schematic sectional view depicting an example of an ozone gas generation processing apparatus of the present invention.

Hereinafter, descriptions will be given with reference to the drawings. FIG. 1 is a schematic diagram depicting an example of an ozone gas generation processing apparatus of the present invention. An ozone gas generation processing apparatus 1 generates ozone gas by irradiating ultraviolet rays in an atmosphere containing oxygen and processes a wafer 12 with the ozone gas.

The ozone gas generation processing apparatus 1 has a mercury lamp 11 that is a light source of ultraviolet rays and a wafer placement section 13 on which the wafer 12 is placed, and, between the mercury lamp 11 and the wafer placement section 13, a light-blocking plate 14 that allows the generated ozone gas to pass therethrough and blocks the ultraviolet rays is disposed.

The ultraviolet rays irradiated from the mercury lamp 11 contain a wavelength of 184.95 nm. When the ultraviolet rays are irradiated in air, an oxygen molecule is broken down by light of a wavelength of 184.95 nm, and ozone gas and atomic oxygen are generated.

The light-blocking plate 14 is not limited to a particular light-blocking plate as long as the light-blocking plate allows the generated ozone gas to pass therethrough and blocks the ultraviolet rays, but it is preferable that the light-blocking plate 14 is formed of a plurality of stacked punching metal sheets. Furthermore, it is preferable that the light-blocking plate 14 is formed of stacked punching metal sheets with the holes of the upper punching metal sheet being shifted from the holes of the lower punching metal sheet.

The ozone gas and the atomic oxygen pass the space and holes between the punching metal sheets forming the light-blocking plate 14 and reach the wafer 12, but most of the ultraviolet rays is blocked. Therefore, since it is possible to perform oxidation processing with the surface of the wafer 12 being little exposed to the ultraviolet rays, an ozone gas concentration near the wafer is reduced, which makes it possible to make an adjustment to make thinner an oxide film 15 that is formed on the surface of the wafer 12. Moreover, since the wafer 12 is not exposed directly to the ultraviolet rays, it is possible to suppress the occurrence of damage to the surface of the wafer 12 caused by the ultraviolet rays.

The light-blocking rate of the light-blocking plate 14 is preferably 95% or more, and more preferably 99% or more but less than 100%. A light-blocking rate of 95% or more is preferable because there is no possibility of the generation of noise in C-V characteristics. The light-blocking plate with a light-blocking rate of less than 100% is preferable because the ozone gas can reliably pass through the light-blocking plate through a narrow space of the light-blocking plate and it is possible to form an oxide film with a desired thickness easily on the wafer surface.

Figure 2:
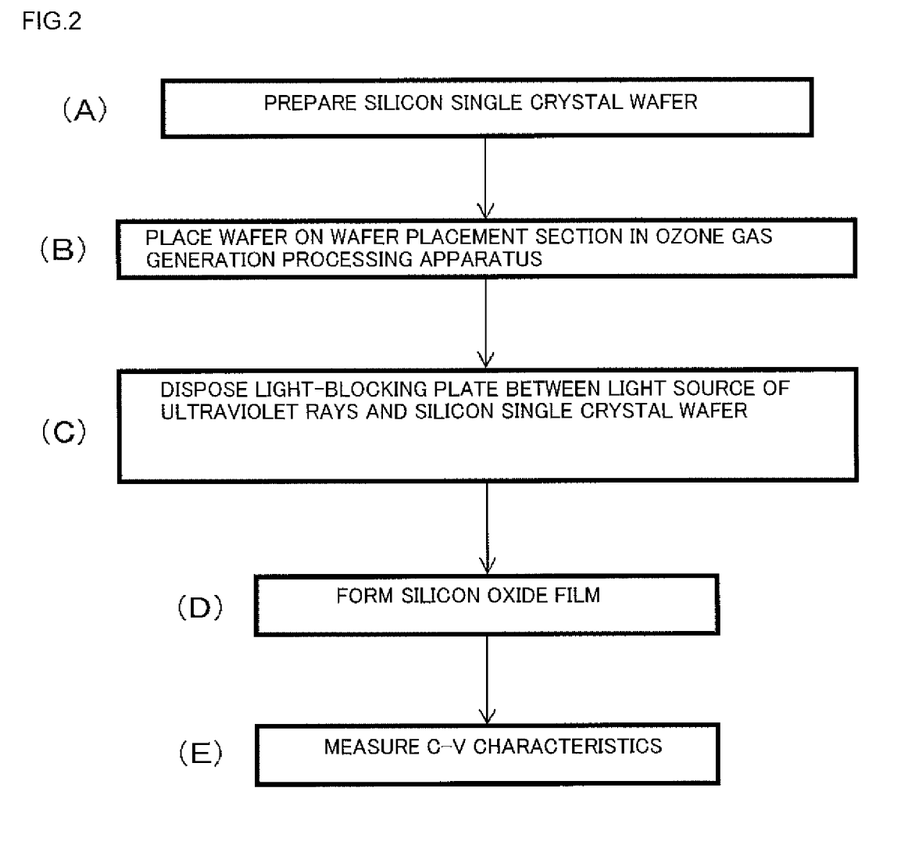
FIG. 2 is a flow diagram describing a method of forming a silicon oxide film of the present invention and a method for evaluating a silicon single crystal wafer of the present invention.

In FIG. 2, a flow diagram depicting an example of a method of forming a silicon oxide film and a method for evaluating a silicon single crystal wafer of the present invention is depicted. First, a silicon single crystal wafer is prepared (FIG. 2(A)).

When C-V characteristics are measured, as a silicon single crystal wafer on which measurement is performed, a silicon single crystal wafer having an n-type region on the surface thereof, in particular, an n-type substrate and a silicon single crystal wafer having an n-type epitaxial layer on the surface thereof can be prepared. Hereinafter, a case where an n-type silicon epitaxial wafer is prepared as the silicon single crystal wafer 12 will be described in detail.

Next, the n-type silicon epitaxial wafer 12 is placed on the wafer placement section 13 in the ozone gas generation processing apparatus 1 (FIG. 2(B)), and the light-blocking plate 14 that allows the generated ozone gas to pass therethrough and blocks ultraviolet rays is disposed between the n-type silicon epitaxial wafer 12 and the mercury lamp 11 (FIG. 2(C)).

Next, when ultraviolet rays are irradiated from the mercury lamp 11 that is a light source of ultraviolet rays in an atmosphere containing oxygen (for example, in air), ozone gas is generated near the mercury lamp 11. The ozone gas passes through the space and holes between the punching metal sheets of the light-blocking plate 14 and reaches the n-type silicon epitaxial wafer 12, but most of the ultraviolet rays is blocked by the light-blocking plate 14.

The ozone gas that has reached the surface of the n-type silicon epitaxial wafer 12 thinly oxidizes the surface of the wafer 12, and a silicon oxide film 15 with a desired thickness is formed on the surface of the n-type epitaxial layer (FIG. 2(D)).

By joining a mercury electrode onto the formed silicon oxide film 15 and applying a reverse bias voltage to the n-type epitaxial layer while continuously varying the reverse bias voltage, a depletion layer formed in the n-type epitaxial layer spreads in accordance with the reverse bias voltage and is measured as capacitance. By plotting the relationship between the reverse bias voltage and the capacitance on a graph, C-V characteristics can be obtained (FIG. 2(E)).

Furthermore, by substituting a reverse bias voltage value and a capacitance value into the following equations (1) and (2), it is possible to calculate the depth W of the n-type epitaxial layer and an impurity concentration N(W) at the depth W and therefore obtain a profile of an impurity concentration in a depth direction in the epitaxial layer.

$$W = A\epsilon_{Si}/C \quad (1)$$

$$N(W) = 2/(q\epsilon_{Si}A^2) \times \{d(C^{-2})/dV\}^{-1} \quad (2)$$

Here, W represents a depletion layer width corresponding to a depth in the epitaxial layer, A represents an area of the mercury electrode (a contact area of mercury when mercury is joined to the surface of the epitaxial layer), $\epsilon_{Si}$ represents the permittivity of silicon, C represents capacitance, N(W) represents an impurity concentration at the depth W in the epitaxial layer, q represents the charge amount of an electron, and V represents an applied voltage.

By specifying a measurement depth in a profile of an impurity concentration in a depth direction in the epitaxial layer, it is possible to measure an impurity concentration at that depth. Moreover, by converting the obtained impurity concentration by using a conversion formula such as ASTM STANDARDS F723, it is possible to convert the impurity concentration into resistivity.

By repeatedly measuring the impurity concentration or resistivity obtained in this manner more than once, for example, 10 times continuously in the same place in the epitaxial wafer, it is possible to evaluate the stability of the C-V characteristics as the accuracy of repeated measurement. The accuracy of repeated measurement is calculated by using the following equation (3) by obtaining an average value x and a standard deviation σ from the 10 measurement values, for example. Incidentally, at the time of repeated measurement, the mercury electrode is temporarily separated from the epitaxial wafer after each measurement and then joined again to the epitaxial wafer.

$$\text{The accuracy of repeated measurement} = 1\sigma/x \times 100(\%) \quad (3)$$

By forming the silicon oxide film 15 on the surface of the n-type epitaxial layer while blocking the ultraviolet rays by using the light-blocking plate 14, it is possible to obtain a stable measurement value of C-V characteristics (improve the accuracy of repeated measurement) and set the accuracy of repeated measurement at 0.5% or less when the light-blocking rate is 95% or more, in particular.

EXAMPLES

Hereinafter, the present invention will be described more specifically with examples and a comparative example, but the present invention is not limited to these examples.
Making of a Light-blocking Plate Four punching metal sheets, each with a steel grade having holes of a diameter of 3 mm, a pitch of 5 mm and a 60° staggered arrangement, and having a thickness of 1.5 mm were prepared and disposed between a wafer and a light source of ultraviolet rays in an ozone gas generation processing apparatus in such a way as to obtain the highest possible light-blocking rate with each number of sheets (1 to 4).

Incidentally, the light-blocking rate of each light-blocking plate was measured by using an illuminometer in a darkroom. The light-blocking plate was illuminated by a 19,000 Lx halogen lamp from one side thereof, and the illuminance of the transmitted light was measured with the illuminometer placed in a 10-mm position on the opposite side with the locations of the holes of the laminated (in actuality, stacked) punching metal sheets being gradually shifted. The lowest illuminance and the light-blocking rate obtained for each light-blocking plate are listed in Table 1. In Table 1, "the number of punching metal sheets 0" corresponds to a case where a light-blocking plate is not used. As listed in Table 1, it is revealed that, by gradually shifting the locations of the holes when the punching metal sheets are stacked, it is possible to improve the light-blocking rate greatly.

TABLE 1

|  | Comparative Example 1 | Example 1 | Example 2 | Example 3 | Example 4 |
|---|---|---|---|---|---|
| The number of punching metal sheets | 0 | 1 | 2 | 3 | 4 |
| Illuminance | 19,000 Lx | 6,050 Lx | 950 Lx | 190 Lx | 12 Lx |
| Light-blocking rate | 0.0% | 68.2% | 95.0% | 99.0% | 99.9% |
| Silicon oxide film thickness | 0.4 nm | 0.3 nm | 0.3 nm | 0.3 nm | 0.2 nm |
| The accuracy of repeated measurement | 6.41% | 0.98% | 0.46% | 0.41% | 0.17% |

Examples 1 to 4, Comparative Example 1

Forming a Silicon Oxide Film

As Comparative Example 1, a silicon oxide film was formed in the ozone gas generation processing apparatus without using a light-blocking plate. Moreover, a silicon oxide film was formed in each of cases where, in the ozone gas generation processing apparatus, a light-blocking plate formed of one punching metal sheet was used (Example 1), a light-blocking plate formed of two stacked punching metal sheets was used (Example 2), a light-blocking plate formed of three stacked punching metal sheets was used (Example 3), and a light-blocking plate formed of four stacked punching metal sheets was used (Example 4).

The light-blocking plate was disposed between an n-type epitaxial wafer and a mercury lamp in the ozone gas generation processing apparatus. The distance from the lower end of the mercury lamp to the light-blocking plate was set at about 10 mm. Moreover, the n-type epitaxial wafer was an n-type silicon single crystal wafer with a plane direction (100) and a diameter of 200 mm having an epitaxial layer with a resistivity of about 0.7 Ωcm formed by vapor phase growth thereon, and the n-type epitaxial wafer within 24 hours after vapor phase growth was used.

Ultraviolet rays containing a wavelength of 184.95 nm were irradiated from a low-pressure mercury lamp for five minutes in air, the low-pressure mercury lamp whose output at 254 nm was 28000 μW/cm$^2$ (6-mm separation position), whereby approximately 70 ppm ozone gas was generated. The concentration of ozone was reduced to approximately 60 ppm after the ozone passed through the light-blocking plate formed of three stacked punching metal sheets. After the ultraviolet rays were irradiated, purging was performed for five minutes to discharge the atmosphere containing ozone from the ozone gas generation apparatus.

The results of the measurement of the thickness of the silicon oxide film formed on the surface of the n-type epitaxial wafer by XPS (X-ray photoelectron spectroscopy) method are listed in Table 1. The thickness of the oxide film was 0.4 nm when a light-blocking plate was not used (Comparative Example 1), 0.3 nm in the case of the light-blocking plates formed of one to three punching metal sheets (Examples 1 to 3), and 0.2 nm in the case of the light-blocking plate formed of four punching metal sheets (Example 4).
Measurement of C-V Characteristics The n-type epitaxial wafer was taken out from the ozone gas generation processing apparatus, a mercury. electrode was joined onto the silicon oxide film formed on the surface of the epitaxial layer, and measurement of C-V characteristics was performed.

Figure 3:
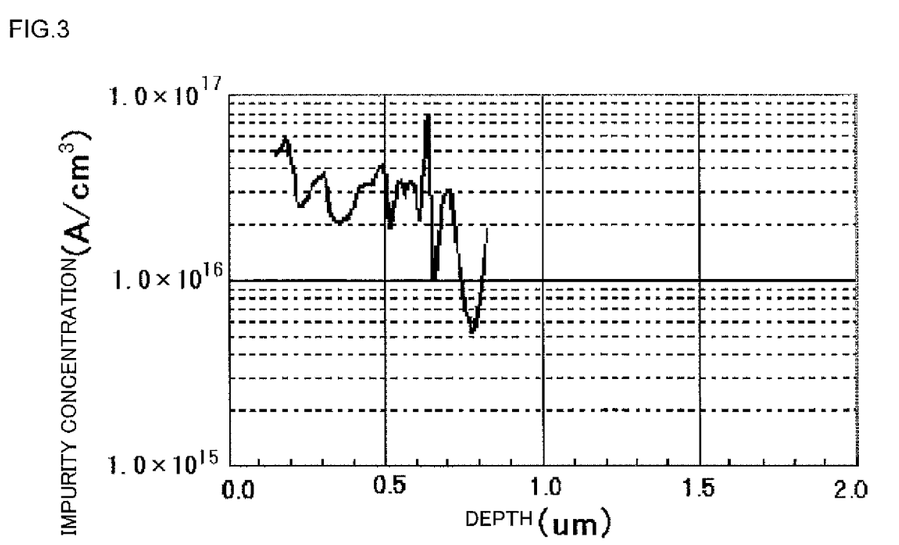
FIG. 3 is a graph in which the relationship between the depth W of an epitaxial layer and an impurity concentration N(W) is calculated from the C-V characteristics measured in a comparative example.
Figure 4:
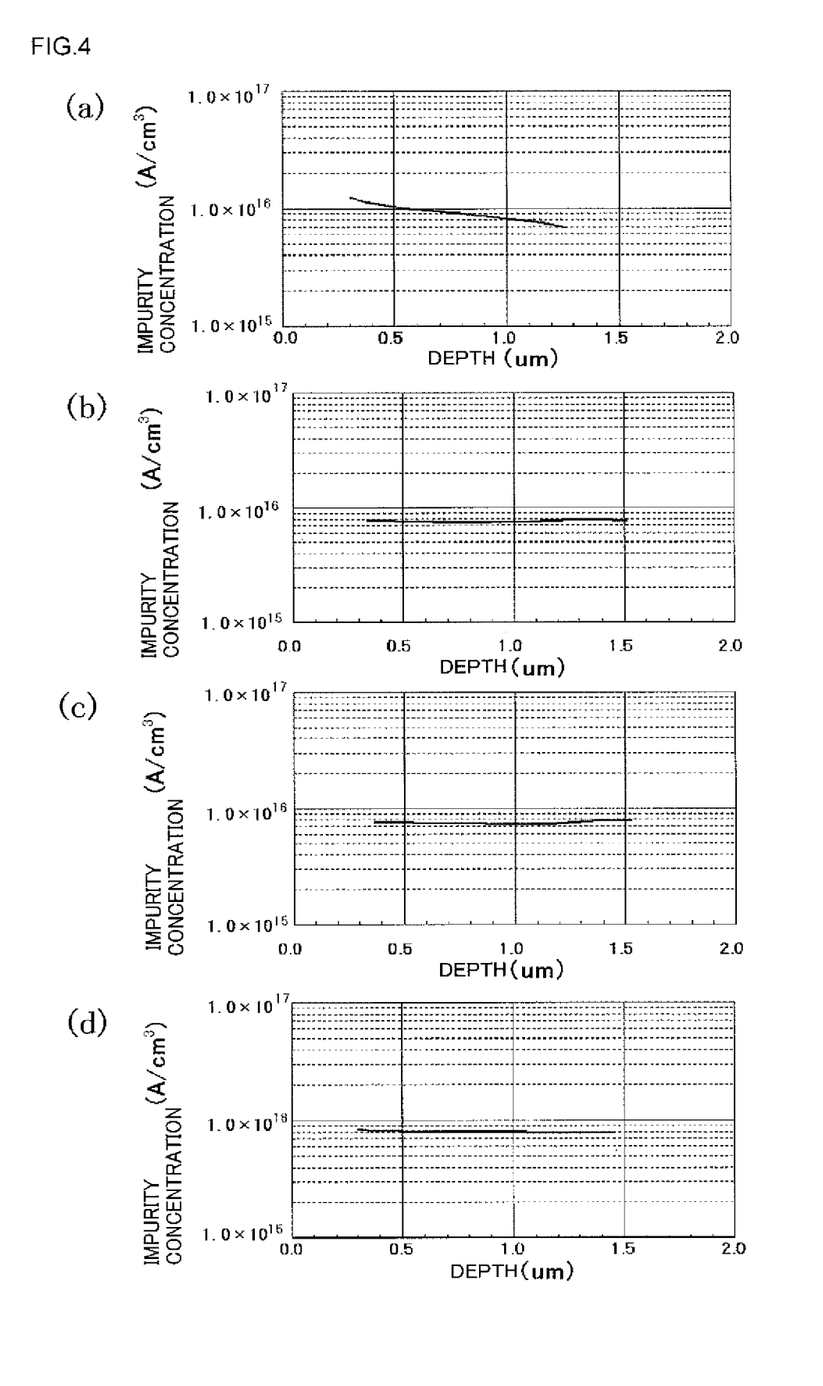
FIG. 4 is a graph in which the relationship between the depth W of an epitaxial layer and an impurity concentration N(W) is calculated from the C-V characteristics measured in examples.

The measurement was performed with a reverse bias voltage being continuously changed to 15V at a frequency of 1 MHz. Then, the relationship between the depth W and the impurity concentration N(W) of the epitaxial layer was calculated from the C-V characteristics thus obtained and graphed (FIG. 3 depicts Comparative Example and FIGS. 4(a) to (d) depict Examples 1 to 4, respectively.). As a result, while, in Comparative Example 1 in which the light-blocking plate is not used, the graph is obviously inclined and noise is frequently generated due to damage caused as a result of the wafer surface being exposed to the ultraviolet rays (FIG. 3), in Examples 1 to 4 in which the light-blocking plate is used, noise is not generated, and the graphs are hardly inclined in Example 2, Example 3, and Example 4 in which the light-blocking plates with a light-blocking rate of 95% or more are used (FIG. 4(b), FIG. 4(c), and FIG. 4(d)).

Next, an impurity concentration at a depth of 0.5 μm of the epitaxial layer was obtained. After the measurement of the C-V characteristics, the mercury electrode was separated from the n-type epitaxial wafer in each measurement. This operation was repeatedly performed 10 times at the center of the n-type epitaxial wafer, and the accuracy of repeated measurement 1σ/x×100(%) is listed in Table 1.

As in Table 1, in Examples 1 to 4 in which the light-blocking plates were used, the accuracy of repeated measurement was greatly improved as compared to Comparative Example 1. In particular, in Example 2, Example 3, and Example 4 in which the light-blocking plates with a light-blocking rate of 95% or more were used, the accuracy of repeated measurement was 0.5% or less.

It is to be noted that the present invention is not restricted to the foregoing embodiment. The foregoing embodiment is just an illustrative example, and any example that has substantially the same configuration and exercises the same functions and effects as the technical concept described in claims is included in the technical scope of the present invention.

The invention claimed is:

1. An ozone gas generation processing apparatus that includes a light source of ultraviolet rays and a wafer placement section, generates ozone gas by irradiating ultraviolet rays from the light source in an atmosphere containing oxygen, and processes a wafer on the wafer placement section with ozone gas, the ozone gas generation processing apparatus comprising a light-blocking plate that allows the generated ozone gas to pass therethrough and blocks the ultraviolet rays between the light source and the wafer placed on the wafer placement section:

wherein a light-blocking rate of the light-blocking plate is 95% or more and less than 100%.

2. The ozone gas generation processing apparatus according to claim 1, wherein the light-blocking plate is formed of a plurality of stacked punching metal sheets.

3. A method of forming a silicon oxide film including:

generating ozone gas by irradiating ultraviolet rays in an atmosphere containing oxygen and forming a silicon oxide film on a silicon single crystal wafer surface by processing with the generated ozone gas, the method comprising: disposing a light-blocking plate that allows the generated ozone gas to pass therethrough and blocks the ultraviolet rays between a light source of the ultraviolet rays and the silicon single crystal wafer; and forming the silicon oxide film by making the ozone gas passed through the light-blocking plate react with the silicon single crystal wafer surface while blocking the ultraviolet rays;

wherein the light-blocking plate with a light-blocking rate of 95% or more and less than 100% is used.

4. A method for evaluating a silicon single crystal wafer comprising: forming a silicon oxide film on a silicon single crystal wafer surface by the method of forming a silicon oxide film according to claim 3; and measuring C-V characteristics by joining a mercury electrode to the silicon oxide film.

5. The method for evaluating a silicon single crystal wafer according to claim 4, wherein the silicon single crystal wafer on which measurement is performed has an n-type region on the surface thereof.

6. The method for evaluating a silicon single crystal wafer according to claim 4, wherein the silicon single crystal wafer on which measurement is performed has an n-type epitaxial layer on the surface thereof.

7. The method for evaluating a silicon single crystal wafer according to claim 5, wherein the silicon single crystal wafer on which measurement is performed has an n-type epitaxial layer on the surface thereof.

* * * * *